United States Patent
Gaulter et al.

(10) Patent No.: US 12,314,645 B2
(45) Date of Patent: *May 27, 2025

(54) METHOD AND SYSTEM FOR VERIFYING A SORTER

(71) Applicant: Imagination Technologies Limited, Kings Langley (GB)

(72) Inventors: Simon Gaulter, Hertfordshire (GB); Thomas Ferrere, Hertfordshire (GB); Faizan Nazar, Hertfordshire (GB); Sam Elliott, London (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/377,746

(22) Filed: Oct. 6, 2023

(65) Prior Publication Data
US 2024/0037303 A1 Feb. 1, 2024

Related U.S. Application Data

(63) Continuation of application No. 17/207,030, filed on Mar. 19, 2021, now Pat. No. 11,783,105.

(30) Foreign Application Priority Data

Mar. 19, 2020 (GB) ...................................... 2003988

(51) Int. Cl.
*G06F 30/30* (2020.01)
*G06F 30/33* (2020.01)

(52) U.S. Cl.
CPC .................................. *G06F 30/33* (2020.01)

(58) Field of Classification Search
CPC ......... G06F 30/33; G06F 7/24; G06F 30/3323
See application file for complete search history.

(56) References Cited

U.S. PATENT DOCUMENTS

| | | | | |
|---|---|---|---|---|
| 4,520,456 A | * | 5/1985 | Miranker | ................... G06F 7/24 712/202 |
| 6,457,162 B1 | * | 9/2002 | Stanion | ............... G06F 30/3323 716/107 |
| 10,474,533 B2 | * | 11/2019 | Jennings | ............. G06F 11/2028 |
| 2009/0245092 A1 | * | 10/2009 | Sampath | ............. H04L 27/2651 370/210 |

OTHER PUBLICATIONS

Claessen et al., "The Design and Verification of a Sorter Core," 12th European Conference on Computer Vision, pp. 355-368, 2001.

(Continued)

*Primary Examiner* — Jack Chiang
*Assistant Examiner* — Brandon Bowers
(74) *Attorney, Agent, or Firm* — Potomac Law Group, PLLC; Vincent M DeLuca

(57) ABSTRACT

Methods and systems of verifying a hardware design for a sorter are disclosed. The methods include generating a modified version of the hardware design of the sorter accepting extended inputs and performing formal verification comprising: implementing a constraint that the least significant bits of each input in a set of extended inputs represent a unique value; and formally verifying aspects of the modified version of the hardware design of the sorter for the set of extended inputs.

19 Claims, 9 Drawing Sheets

(56) References Cited

OTHER PUBLICATIONS

Claessen et al., "Using Lava to Design and Verify Recursive and Periodic Sorters," Int'l Journal on Software Tools for Technology Transfer, vol. 4, pp. 349-358, 2003.
Andraus, Automatic Formal Verification of Control Logic in Hardware Designs, URL: https://deepblue.lib.umich.edu/bitstream/handle/2027.42/63881/zandrawi_1. pdf?sequence= I &isAllowed=y sections 1, 6.1, 7.2; figure 7.2, 2009.

\* cited by examiner

METHOD AND SYSTEM FOR VERIFYING A SORTER

CROSS-REFERENCE TO RELATED APPLICATIONS AND CLAIM OF PRIORITY

This application is a continuation under 35 U.S.C. 120 of application Ser. No. 17/207,030 filed Mar. 19, 2021, now U.S. Pat. No. 11,783,105, which claims foreign priority under 35 U.S.C. 119 from United Kingdom Application No. 2003988.9 filed Mar. 19, 2020, the contents of which are incorporated herein by reference in their entirety.

BACKGROUND

Many electronic devices, such as systems-on-chips (SoCs), include elements that implement a sorting functionality, known as 'sorters'. Such sorters can implement different types of sorting algorithms (e.g. the bubble-sort or merge-sort algorithms, among many other well-known algorithms). Such sorters can also work with different types of data, such as text or numbers. For the purposes of this document the type of algorithm or data is not important. In all cases, it is desirable to be able to verify that the sorter operates correctly.

A hardware design may be verified, for example, by formal verification or simulation-based verification. Formal verification is a systematic process that uses a mathematical model of the hardware design and mathematical reasoning to verify the hardware design. In contrast, simulation-based verification is a process in which a hardware design is tested by applying stimuli to an instantiation of the hardware design and monitoring the output of the instantiation of the hardware design in response to the stimuli.

Formal verification can improve controllability as compared to simulation-based verification. Low controllability occurs when the number of simulation test signals or vectors required to thoroughly simulate a hardware design becomes unmanageable. For example, a 32-bit comparator requires $2^{64}$ test vectors. This may take millions of years to verify exhaustively by simulation-based verification. By performing formal verification, the 32-bit comparator can be verified in less than a minute.

In formal verification, the hardware design is transformed into a mathematical model (e.g. a state-transition system, or a flow graph) to thereby provide an instantiation of the hardware design which can be tested to verify the hardware design, and formal properties to be verified are expressed using mathematical logic using a precise syntax or a language with a precise mathematical syntax and semantics.

Formal verification is performed using a formal verification tool (i.e. a software tool that is capable of performing formal verification of a hardware design). Some formal verification tools, such as formal equivalence checkers (e.g. Synopsys® HECTOR and other logical equivalence checkers (LECs) and sequential logical equivalence checkers (SLECs)) are proficient at verifying properties related to data transformations (such as arithmetic operations), but can typically only be used to prove a property over a finite period of time. Other verification tools, such as formal property checkers, which may also be referred to as formal model checkers, (e.g. OneSpin 360 DV™, Mentor Graphics Questa® Formal Verification, Synopsys® VC Formal, Cadence® Incisive® Enterprise Verifier, and JasperGold®) are proficient at verifying a property over an infinite time period but are poor at verifying properties related to data transformations (such as arithmetic operations).

While formal verification can be an effective method for exhaustively verifying properties of a hardware design, this is only true if the properties that are to be verified are presented in such a manner that a formal verification tool can solve the mathematical problem presented thereby. When a formal verification tool is able to solve the mathematical problem presented by the hardware design and the properties to be verified then the formal verification is said to converge. When, however, a formal verification tool is unable to solve the mathematical problem presented by the hardware design and the properties to be verified, then the formal verification does not converge, and no results are output, and the verification is inconclusive.

Whilst sorters are conceptually simple, conventional or 'naïve' formal varication of sorters involves complexity that leads to slowness to converge, this becoming more pronounced for large multisets of inputs. Alternative verification approaches have their own drawbacks. Simulation testing is possible but can become prohibitively computationally expensive as the number of inputs, and the bit width thereof, increases. Any non-comprehensive testing also introduces the problem of designing adequate test datasets and introduces the chance of an error going undetected. Another option is to perform equivalence checking against another sorter. However, that introduces different problems, depending on whether or not the other sorter is based on the same underlying algorithm. If it is based on the same algorithm, then there is a chance that both sorters will suffer from the same error that arises as an artefact of the algorithm or the way it is likely to be implemented. Such an error will not be detected by the equivalence checking (i.e. because both sorters will output erroneous results, but the results from each sorter will be the same and thus they will appear to corroborate that the two sorters are both working correctly). On the other hand, if the other sorter is not based on the same algorithm, there is an increased chance that the verification will not converge, making the equivalence check inconclusive.

The embodiments described below are provided by way of example only and are not limiting of implementations which solve any or all of the disadvantages of known methods and systems for verifying a hardware design for a sorter.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods and systems of verifying a hardware design for a sorter are disclosed. The methods include generating a modified version of the hardware design of the sorter accepting extended inputs and performing formal verification comprising: implementing a constraint that the least significant bits of each input in a set of extended inputs represent a unique value; and formally verifying aspects of the modified version of the hardware design of the sorter for the set of extended inputs.

According to a first aspect there is provided a method of verifying a hardware design for a sorter, the sorter accepting base inputs each of a bit width m, the method comprising one or more of the following steps: generating a modified version of the hardware design of the sorter accepting extended inputs with a bit width m+q; and performing formal verification comprising: implementing a constraint that q least significant bits of each input in a set of extended inputs represent a unique value; and formally verifying aspects of the modified version of the hardware design of the sorter for the set of extended inputs.

Optionally, the step of performing formal verification can further comprise: implementing a constraint that the most significant m bits of each extended input in the set of extended inputs are equal to a respective one of a set of base inputs for an unmodified version of the hardware design of the sorter receiving the set of base inputs; and wherein formally verifying aspects of the modified version of the hardware design of the sorter for the set of extended inputs comprises formally verifying that the most significant m bits of each sorted output of the modified version of the hardware design of the sorter are equal to a respective output obtained by an unmodified version of the hardware design of the sorter receiving the set of base inputs.

Optionally, the set of base inputs consists of n inputs, and $q \geq \lceil \log_2 n \rceil$. Further optionally, the q least significant bits of each input in the set of extended inputs can represent a unique value from 0 to n−1.

Optionally the set of base inputs consists of n inputs and $q \geq n$. Further optionally, the q least significant bits of each input in the set of extended inputs can implement a unique one hot encoding.

Optionally, formally verifying aspects of the modified version of the hardware design of the sorter for the set of extended inputs comprises formally verifying set equality between the set of extended inputs and the set of outputs of the modified version of the hardware design of the sorter. Further optionally, performing formal verification further comprises formally verifying ordering by either: further formally verifying aspects of the modified version of the hardware design of the sorter for the set of extended inputs by formally verifying the ordering of the outputs of the modified version of the hardware design of the sorter; or formally verifying the ordering of the outputs of unmodified version of the hardware design of the sorter.

Optionally, formally verifying the set equality can comprise verifying that each of the outputs appears as an input. Formally verifying ordering can comprise verifying that the outputs of the modified version of the hardware design of the sorter are in sequence and that neighbouring outputs are not equal. Alternatively, formally verifying the set equality can comprise verifying that each of the inputs appears as an output. Formally verifying the ordering can comprise verifying that the outputs of the modified version or unmodified version of the hardware design of the sorter are in sequence.

Optionally, the step of performing formal verification further comprises implementing a constraint that all the inputs in the set of base inputs are valid inputs for the unmodified version of the hardware design of the sorter, and that all the inputs in the set of extended inputs are valid inputs for the modified version of the hardware design of the sorter.

Optionally, performing formal verification further comprises a step of outputting one or more signals that indicate whether the verification was successful.

Optionally, the method further comprises a step of revising the hardware design for a sorter if the formal verification is not successful.

Optionally, the method further comprises, if the formal verification is successful, a step of manufacturing an integrated circuit comprising a sorter according to the hardware design for a sorter.

According to a second aspect, there is a provided a method of manufacturing, using an integrated circuit manufacturing system, an integrated circuit comprising a sorter according to a hardware design for a sorter that has been verified according to any variation of the first aspect.

According to a third aspect, there is a provided a method of manufacturing, using an integrated circuit manufacturing system, an integrated circuit comprising a sorter, the method comprising: verifying the hardware design for the sorter according to the method of any variation of the first aspect, wherein the hardware design is in the form of a computer readable description of the integrated circuit comprising the sorter; and processing, using a layout processing system, the computer readable description so as to generate a circuit layout description of the integrated circuit comprising the sorter; and manufacturing, using an integrated circuit generation system, the integrated circuit comprising the sorter.

According to a fourth aspect, there is provided a system for verifying a hardware design a hardware design for a sorter, the sorter accepting base inputs each of a bit width m, the system comprising one of more of: memory configured to store: a modified version of the hardware design of the sorter, accepting extended inputs with a bit width m+q; and a formal verification tool; and one or more processors configured to performing formal verification, using the formal verification tool, by: implementing a constraint that q least significant bits of each input in a set of extended inputs represent a unique value; and formally verifying aspects of the modified version of the hardware design of the sorter for the set of extended inputs.

Optionally, the one or more processors are configured to perform formal verification, using the formal verification tool, by further: implementing a constraint that the most significant m bits of each extended input in the set of extended inputs are equal to a respective one of a set of base inputs for an unmodified version of the hardware design of the sorter receiving the set of base inputs; and formally verifying aspects of the modified version of the hardware design of the sorter for the set of extended inputs comprises formally verifying that the most significant m bits of each sorted output of the modified version of the hardware design of the sorter are equal to a respective output obtained by an unmodified version of the hardware design of the sorter receiving the set of base inputs.

Optionally, the set of base inputs consists of n inputs and $q \geq \lceil \log_2 n \rceil$. The q least significant bits of each input in the set of extended inputs can represent a unique value from 0 to n−1.

Optionally, the set of base inputs consists of n inputs and $q \geq n$. The q least significant bits of each input in the set of extended inputs can implement a unique one hot encoding.

Optionally, formally verifying aspects of the modified version of the hardware design of the sorter for the set of extended inputs further comprises formally verifying set equality between the set of extended inputs and the set of outputs of the modified version of the hardware design of the sorter.

Optionally, performing formal verification further comprises formally verifying ordering by either: further formally verifying aspects of the modified version of the hardware design of the sorter for the set of extended inputs by formally verifying the ordering of the outputs of the modified version of the hardware design of the sorter; or formally verifying the ordering of the outputs of unmodified version of the hardware design of the sorter.

Optionally, formally verifying the set equality can comprise verifying that each of the outputs appears as an input.

Formally verifying the ordering can comprise verifying that the outputs of the modified version of the hardware design of the sorter are in sequence and that neighbouring outputs are not equal. Alternatively, formally verifying the set equality can comprise verifying that each of the inputs appears as an output. Formally verifying the ordering can comprise verifying that the outputs of the modified version or unmodified version of the hardware design of the sorter are in sequence.

Optionally the one or more processors are configured to perform formal verification, using the formal verification tool, by further implementing a constraint that all the inputs in the set of base inputs are valid inputs for the unmodified version of the hardware design of the sorter, and that all the inputs in the set of extended inputs are valid inputs for the modified version of the hardware design of the sorter.

Optionally, the one or more processors are configured to perform formal verification, using the formal verification tool, by further outputting one or more signals that indicate whether the verification was successful.

According to a fifth aspect, there is provided computer readable code configured to cause the method of any variation of the first or second aspect to be performed when the code is run.

According to a sixth aspect, there is provided a computer readable storage medium having encoded thereon the computer readable code of the fifth aspect.

According to a seventh aspect, there is provided a method of verifying a hardware design for a sorter, the sorter accepting base inputs each of a bit width m, the method comprising one or more of the following steps: generating a modified version of the hardware design of the sorter accepting extended inputs with a bit width m+q; and performing formal verification comprising: implementing a constraint that q least significant bits of each input in a set of extended inputs represent each base input as a unique value; and formally verifying the hardware design for the sorter accepting base inputs each of a bit width m by formally verifying aspects of the modified version of the hardware design of the sorter for the set of extended inputs.

According to an eighth aspect, there is provided a system for verifying a hardware design a hardware design for a sorter, the sorter accepting base inputs each of a bit width m, the system comprising one of more of: memory configured to store: a modified version of the hardware design of the sorter, accepting extended inputs with a bit width m+q; and a formal verification tool; and one or more processors configured to performing formal verification, using the formal verification tool, by: implementing a constraint that q least significant bits of each input in a set of extended inputs represent each base input as a unique value; and formally verifying the hardware design for the sorter accepting base inputs each of a bit width m by formally verifying aspects of the modified version of the hardware design of the sorter for the set of extended inputs.

A hardware design for a sorter, when processed in an integrated circuit manufacturing system, may configure the system to manufacture the sorter. There may be provided a non-transitory computer readable storage medium having stored thereon a hardware design for a sorter verified according to the first aspect discussed above that, when processed in an integrated circuit manufacturing system, causes the integrated circuit manufacturing system to manufacture an integrated circuit embodying the sorter.

There may be provided an integrated circuit manufacturing system comprising: a non-transitory computer readable storage medium having stored thereon a hardware design for a sorter verified according to the first aspect discussed above; a layout processing system configured to process the hardware design so as to generate a circuit layout description of an integrated circuit embodying the sorter; and an integrated circuit generation system configured to manufacture the sorter according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
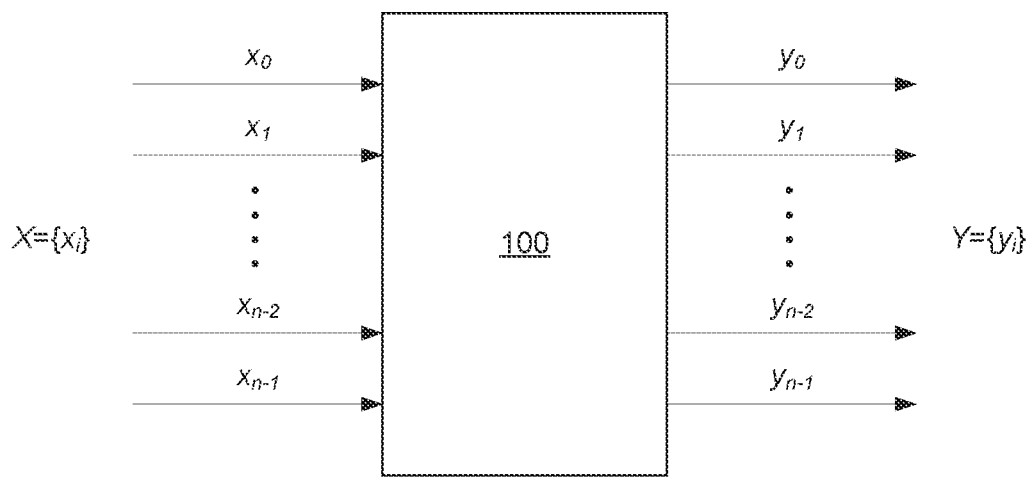
FIG. 1 is a block diagram of an example sorter.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments are described by way of example only.

When considering sorters, there are three requirements that a conventional formal verification seeks to prove: (i) that the outputs are correctly ordered; (ii) that every output is the same as an input (or vice versa); and (iii) that the inputs and outputs have the same multiplicity (i.e. that every input appears in the outputs the correct number of times).

These three requirements are presented in order of increasing complexity. The requirement that the outputs are in order is relatively easy to verify. The requirement that every output is also an input is also usually feasible to verify, though will likely be harder than the ordering property. However, the third requirement is easily the most complex to verify, and can make formal verification of sorters slow, or even lead to failure to converge, particularly as the size of the sorter (i.e. the number of inputs it receives) increases.

The issue of multiplicity is now considered further with reference to FIGS. 1 and 2A-2C.

FIG. 1 illustrates a sorter 100 accepting a set X of inputs $x_i$, and producing a set Y of outputs $y_i$. The requirements for a formal verification of the sorter 100 differ depending on whether sets X and Y are strict sets or multisets. In this document, the term 'strict set' is used to refer to a set without any repeated values, whilst 'multiset' is used to refer to a set in which it is possible for multiple elements to have the same value. It may or may not be known if a set is a strict set or a multiset, and the use of the unqualified term 'set' in this document is not in itself specific to being a strict set or a multiset (i.e. it is a general term), although the context of use may imply it refers to one or the other in a particular circumstance.

Verifying equality between two strict sets (i.e. without any repeated values within either set) is relatively inexpensive in formal verification. Given equal-sized strict sets $X=\{x_i\}$ and $Y=\{y_i\}$ for i=0, ..., n−1, to show set equality it is sufficient to show that $x_i \in Y \forall i \in \{0, 1, ..., n-1\}$ (or alternatively that that $y_i \in X \forall i \in \{0, 1, ..., n-1\}$) whereupon, by the pigeon hole principle, it follows that the sets are equal.

In other words, for a strict set sorter, it can be confirmed that every input $x_i$ appears in the set of outputs by comparing it with each output $y_i$ to confirm that it is present in the output set Y. As long as the individual inputs are unique, and there are as many outputs as inputs, if each input is checked and confirmed to be present as an output, then it can also be confirmed that the sets are equal. This is illustrated graphically in FIG. 2a, in which every input is unique, and maps to an output. In this case, if the input and output sets are known to be the same size, it can be inferred that the sets of inputs and outputs are equal. Similarly, the same can be determined by checking that each output $y_i$ appears in the set of inputs X.

However, a complication arises when comparing multisets, in which it is possible for multiple elements contained within to have the same value. In the context of verifying a sorter, if certain inputs have the same value, merely individually checking (i.e. without consideration for possible multiplicity) that each input maps to a corresponding output is not enough. That is because such consideration could lead to two inputs with identical values being considered to map to the same output. In such a situation, it might be concluded that every input has a corresponding output, and thus that all inputs have been passed by the sorter without error. However, as illustrated in FIG. 2B, that conclusion might be erroneous.

Figure 2A:
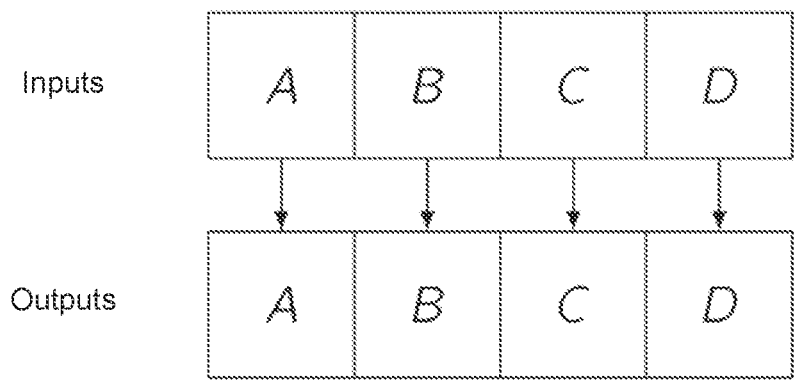
FIG. 2 illustrate examples of comparing inputs and outputs of a sorter, with FIG. 2A illustrating an example without multiplicity of inputs or any errors, FIG. 2B illustrating an example of comparing inputs to outputs in the presence of multiplicity of inputs and an error, and FIG. 2C illustrating an example of comparing outputs to inputs in the presence of multiplicity of inputs and an error.
Figure 2B:
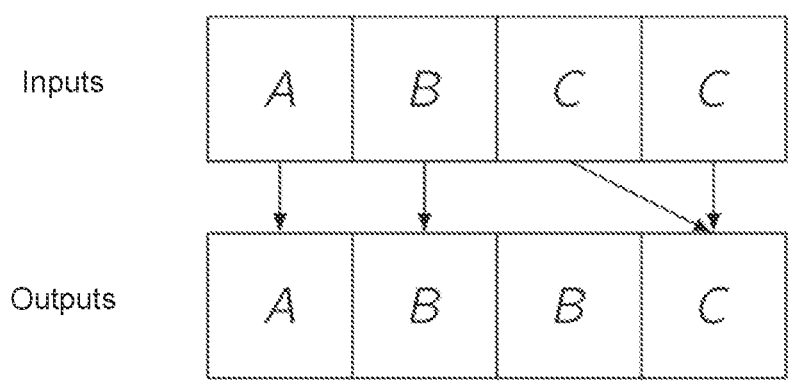

In the example of FIG. 2B, a multiset of elements {A, B, C, C} has been provided as a set of inputs to a sorter (although no reordering by the sorter was required in the example). The sorter passed the inputs with an error, as multiset of outputs {A, B, B, C}. That is, the third and fourth elements of the input multiset have the same value—they are both 'C'. There is only one 'B' in the input multiset, occurring as the second element. However, one of the elements 'C' is erroneously passed as a 'B', meaning that 'B' occurs twice in the output multiset and 'C' only occurs once.

Figure 2C:
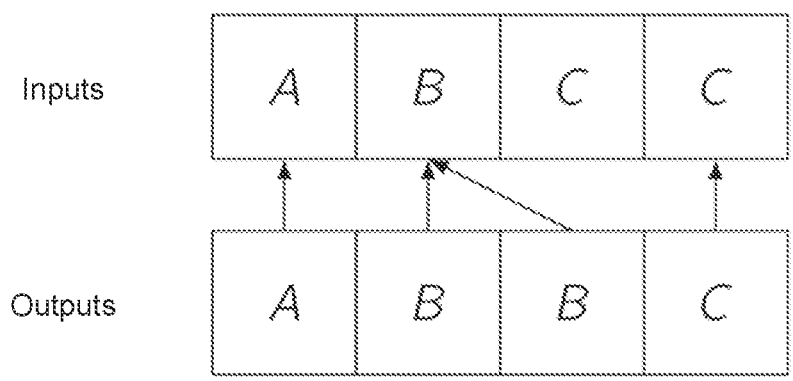

Checking that each input element of FIG. 2B has a corresponding output (without considering multiplicity), as shown by the arrows, would seem to suggest that there are no errors. Similarly, no error would be detected by starting from the outputs and checking they each have a corresponding input, as shown in FIG. 2C (representing the same scenario, but with arrows indicating checks starting from the outputs). In such situations, the error will only be detected by conventional approaches if the multiplicity of the elements in the inputs and outputs is also checked. As mentioned above, that is relatively complex to check computationally, particularly as the input space increases, and thus such a check is slow.

Figure 3:
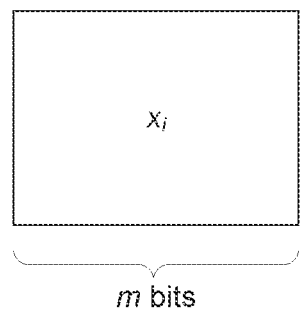
FIG. 3 is a block diagram illustrating an input for a sorter.

FIG. 3 illustrates an input, $x_i$, for a multiset sorter. The individual input has a bit width of m, and there can be n of these inputs to the sorter.

Figure 4:
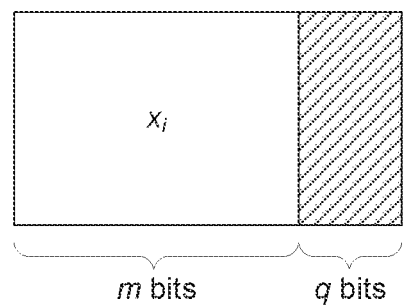
FIG. 4 is a block diagram illustrating a modified input for a sorter.

Inputs to a sorter design are normally parametrizable, to make it easy to alter (e.g. to produce a similar sorter for a different input size). It has been determined that it is possible to exploit this to verify the design of a sorter by considering the case in which the length of each base input of width m is extended by a further q bits, to create extended inputs of length m+q. This is illustrated in FIG. 4, in which the further q bits have been added as the least significant bits (LSBs) of the input.

Although increasing the length of the of each input might be a counterintuitive step towards speeding up the verification of a sorter, because handling longer inputs would appear to increase the complexity of the sorter, it allows for the additional q bits to be used as a unique identifier for the original inputs. That is, starting with a multiset of base inputs of bit width of m, an additional q bits can be appended to each base input which can act as a unique lag' to each input. The unique tag can be used to simplify the verification, as discussed below. It is also noted that the complexity of verifying a sorter is more dependent on the number of inputs than the length of the inputs, such that increasing the length of the input as discussed below is worthwhile in terms of the overall advantage gained.

The number of bits, q, required to provide a unique tag to each input within a multiset of inputs will depend on the size of that multiset and the format of the unique tag.

In one approach, a tag can be incremented starting from a value of '0' and increasing by '1' for every input in the multiset. In this approach, a unique value for every tag can be encoded in $\lceil \log_2 n \rceil$ bits, where n is the number of inputs, such that $q=\lceil \log_2 n \rceil$. This type of encoding is simple and efficient, but there is no need for the unique values to start from '0' and increment by '1' for each new tag—other approaches will simply require a larger q (i.e. so in general $q \geq \lceil \log_2 n \rceil$). For example, if the unique tags started from a lowest value of 2, an extra bit might be required compared to starting from 0.

As an example of another approach, a 'one hot' encoding can be used. That is, in any given tag, each of the q bits can be set to '0' except for one bit set to '1'. A different bit is set to '1' for each different tag. In this approach, the number of bits required for q will be the same as the number of inputs n in the most efficient case (i.e. q=n), but again more bits could be used and the technique would still work (i.e. so in general q≥n).

Thus, even if the original base inputs of bit width m were not unique, the extended inputs can be rendered unique by the appended q bits. Moreover, by appending the unique q bits to the original base inputs as the LSBs, the correct sorting order compared to the original base inputs is not modified. That is because the original m bits of the base inputs are retained as the most significant bits (MSBs) of the extended inputs, and thus the extended inputs will be sorted in the same order as the corresponding base inputs.

The considerations above allow for an improved approach to formally verifying a sorter. In essence, the step of directly verifying the multiset equality can be omitted. This is achieved by considering a modified (or 'verification') version of the original (or 'implementation') sorter design, with the modified design accepting extended inputs with an additional q bits compared to the implementation design, and with the q bits representing unique values for each input. The implementation design can be formally verified by proving the set equality between the inputs and outputs of the verification design, and also proving equality in the most significant m bits between the outputs of the implementation and verification designs. Of course, it is also still necessary to verify that the outputs are in order. As such, the formal verification of the implementation design comprises formally verifying aspects of the verification design.

Figure 5:
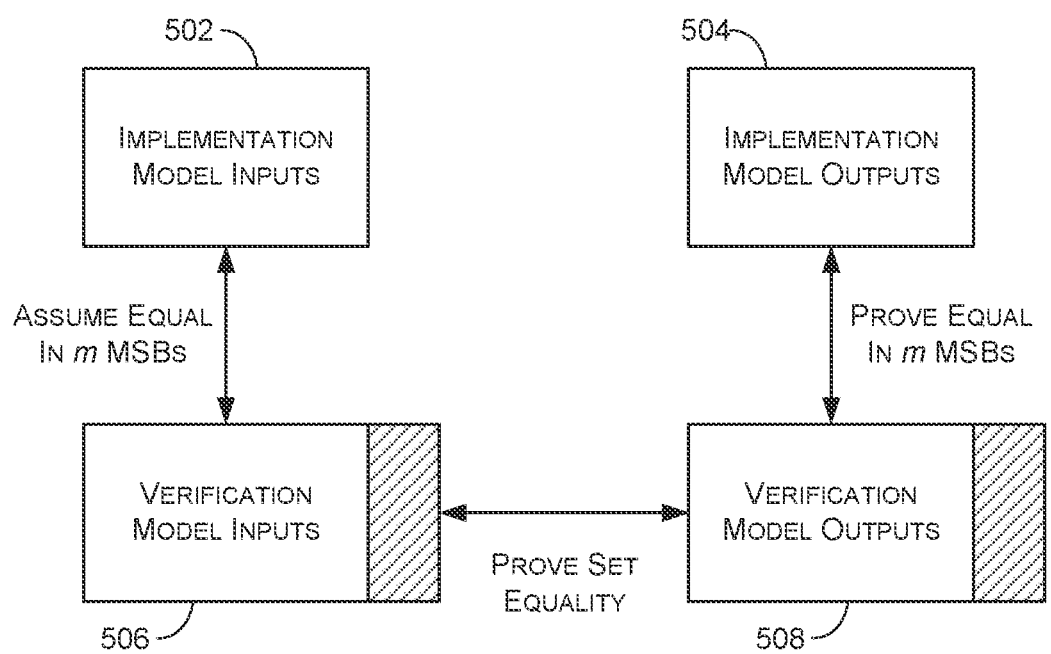
FIG. 5 is a block diagram illustrating an approach to formally verifying a sorter.

FIG. 5 illustrates this approach. The original implementation model is not directly verified, at least not completely. Instead, the implementation design is used to derive a modified verification model for use in the formal verification. Assumptions (also known as 'conditions') are stated regarding inputs 502 to the implementation model and inputs 506 to the verification model. Assertions are used to prove that the verification model provides the correct outputs 508, at least to the extent that there is set equality between its inputs and outputs, and that the outputs 508 of the verification model are the same as for the input implementation model, other than for the inclusion of the unique tags. A further assertion to prove the correct ordering of the outputs can be applied to the implementation or verification model, depending on the details of the implementation (discussed in more detail below). The correct operation of the implementation model can thus be inferred.

For performing the formal verification, the following constraints on the verification (which may be implemented as assumption statements) can be made:

(1) assume that all inputs are valid for the implementation and verification models;

(2) assume that the most significant m bits of each corresponding pair of inputs (i.e. an unextended input to the implementation model, and the corresponding extended input to the verification model) are equal (so that the inputs to the two different models differ only in the low-significance uniqueness bits); and (3) assume that the q bits added to the base inputs, to create the inputs of the verification model, are unique (having a known format such as one of those discussed above).

Assumption (1) effectively limits the verification to consider meaningful inputs (and therefore to ignore errors resulting from improper inputs, which are not useful for understanding the correctness of the sorter design). Assumption (2) codifies that the verification is considering the same base inputs in each model. Assumption (3) eliminates any need to consider multiplicity issues when determining the correctness of the verification model, because each input to the verification model is known to be unique.

The formal verification can then be performed to prove the following assertions:

(a) assert that the input and output sets of the verification model (with unique elements) are equal;

(b) assert that the most significant m bits of each model's corresponding outputs are equal;

(c) assert that the outputs are ordered.

It will be recognised that assertions (a) to (c) are not the same as the three conventional requirements for verifying an individual sorter design discussed earlier, i.e. (i) that the outputs are correctly ordered; (ii) that every output is the same as an input (or vice versa); and (iii) that the inputs and outputs have the same multiplicity. Requirement (i) is similar to assertion (c), although assertion (c) need not be necessarily verified against the implementation model (depending on how assertion (a) is verified, as discussed below). Also, whilst assertion (a) is similar to earlier requirement (ii), it applies to the verification model not the implementation model. Most significantly, in terms of the impact on the verification, earlier requirement (iii) is dispensed with due to the unique nature of the inputs considered in the verification model and it only remains to show, as for assertion (b), that the models behave in the same way with or without the additional q bits of the verification model.

It should be noted that, in contrast to the conventional/naïve approach, verifying assertion (a) does not allow the same conclusions to be drawn when starting from the inputs as for when starting from the outputs. That is, what can be inferred when verifying the assertion is slightly different if testing if all the inputs appear as outputs, compared to testing if all the outputs were present as inputs. This is linked to the fact that the inputs are already known to be unique, by virtue of the additional q bits. So, if assertion (a) is verified by testing if each input appears as an output, it can be concluded that each output is unique because each input was unique. However, if assertion (a) is verified by testing if each output appears as an input, it cannot be directly inferred that each output is unique, because there remains the possibility that two outputs have mapped to the same input.

Put another way, the possibility of two inputs mapping to the same output is logically excluded (even in the case of a malfunctioning sorter) by the requirement that each input is unique. So, if the input and output sets are the same size, it follows that the outputs must also be unique if each (unique) input can be mapped to an output. However, the requirement that the inputs are unique does not logically exclude the possibility that multiple outputs can be mapped back to a single input (e.g. in the case of a malfunctioning sorter). An erroneous output multiset might have two values which both map to a single (unique) input.

For example, if a strict set of unique input elements {A, B, C, D} are erroneously passed by a sorter as a multiset of elements {A, B, C, C}, a check that every input element appears as an output element will identify that D does not appear as an output element. Thus, the check will identify an error. However, in the same scenario, a check that every output element appears as an input element will not identify that D was present as an input but not as an output. Thus, the error would not be identified from this check alone.

As a result, in terms of implementing the verification, if the equality assertion (assertion (a)) is implemented by checking that every output appears as an input, then the ordering assertion (assertion (c)) should be checked strictly for the verification model, by ensuring both that the output elements are in sequence, and that neighbouring elements in the ordered output are not equal. For example, if checking ordering from largest to smallest, it should be checked that a value is strictly less than, and not just less than or equal to, the previous value.

In contrast, if the equality assertion (assertion (a)) is implemented by checking that every input appears as an output, then the ordering assertion (assertion (c)) can be checked less strictly on either the verification model or the implementation model, by checking that the output elements are in sequence without ensuring that neighbouring elements are not equal. That is because a successful verification of the other assertions already makes it possible to conclude that the outputs will not be equal. So, in the example of checking ordering from largest to smallest, it can simply be checked that a value is less than or equal to the previous value. It will be noted that, if the ordering assertion is checked against the implementation model, the verification model is not itself entirely formally verified, and so only aspects of the verification model are verified to contribute to the formal verification of the implementation model.

Figure 6:
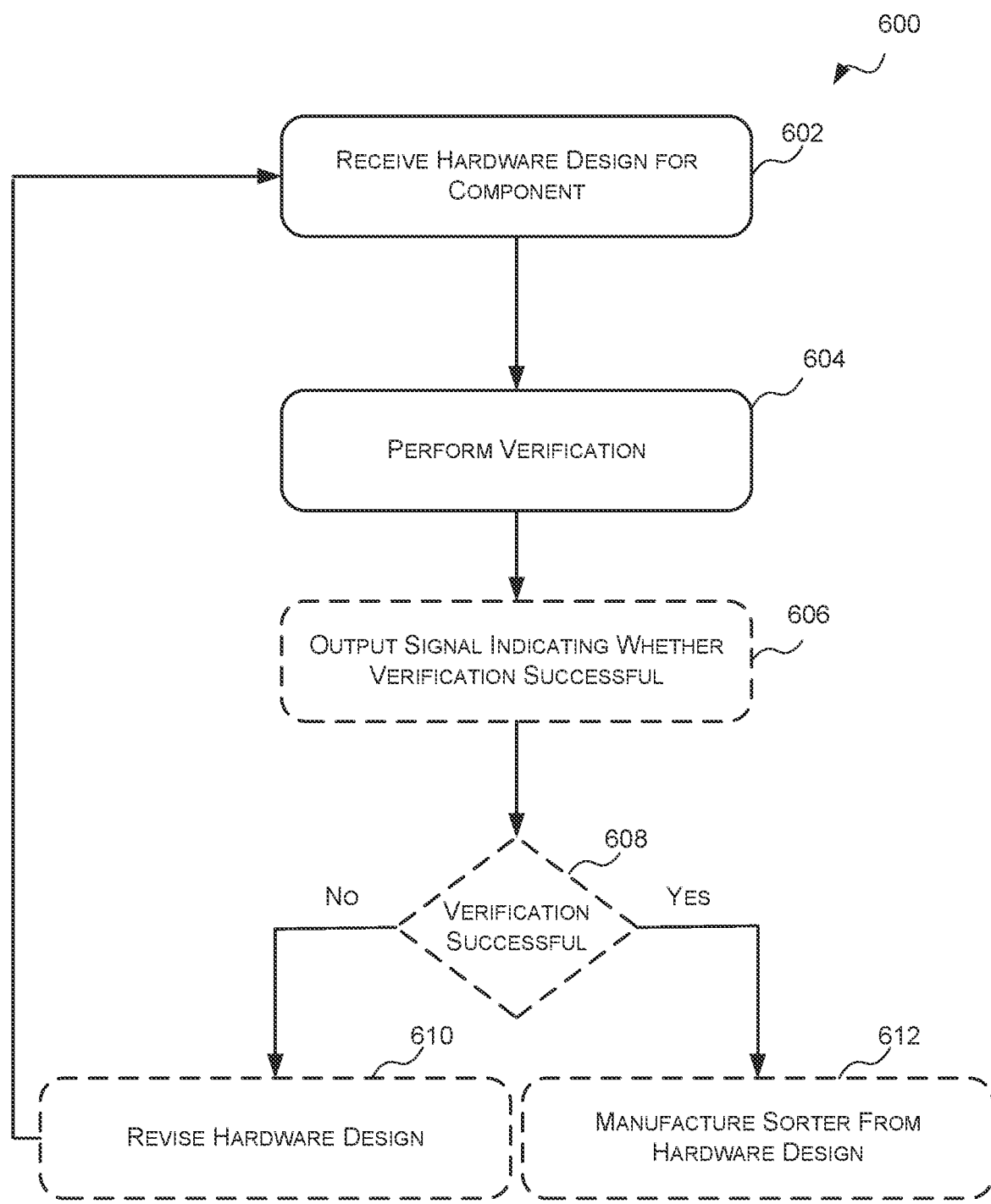
FIG. 6 is a flow chart illustrating a method of formally verifying a sorter.

Reference is now made to FIG. 6, which illustrates an example method 600 of verifying a hardware design for a sorter. The method 600 may be implemented by a computing-based device such as, but not limited to, the computing-based device 800 described below with respect to FIG. 8. For example, there may be a computer readable storage medium having stored thereon computer readable instructions that, when executed at a computing-based device, cause the computing-based device to perform the method 600 of FIG. 6.

A "hardware design" is a description of the structure and function of an integrated circuit which when processed at an integrated circuit manufacturing system causes the integrated circuit manufacturing system to generate an integrated circuit described by the hardware design. For example, as described in more detail below with respect to FIG. 10, when a hardware design is processed at an integrated circuit manufacturing system the integrated circuit manufacturing system may generate the integrated circuit by synthesizing the hardware design into silicon, or, by loading configuration data into a field-programmable gate array (FPGA).

A hardware design may be implemented in a high-level hardware description language (HDL), such as, but not limited to, a register transfer level (RTL) language. Examples of register transfer level languages include, but are not limited to, VHDL (VHSIC Hardware Description Language) and Verilog®. It will be evident to a person of skill in the art that other high-level hardware description languages may be used such as proprietary high-level hardware description languages.

An "instantiation of a hardware design" is a representation of the hardware and/or functionality of the hardware defined by the hardware design. An instantiation of a hardware design includes, but is not limited to, an emulation model of the integrated circuit hardware design that simulates the behaviour of the hardware defined by the hardware design, a synthesized version (e.g. netlist) of the hardware design, a hardware implementation (e.g. integrated circuit or a field-programmable gate array (FPGA)) of the hardware design, and a mathematical model of the hardware design generated by a formal verification tool. An instantiation of the hardware design embodies the hardware design in a form which can be tested to verify the hardware design.

A hardware design for a sorter is thus a description of the structure and function of an integrated circuit that implements a sorting function which, when processed at an integrated circuit manufacturing system, causes the integrated circuit manufacturing system to generate an integrated circuit that implements the sorting function.

The method 600 comprises formally verifying an instantiation of the hardware design (equivalent to the aforementioned implementation model) by also considering a modified instantiation of the hardware design (equivalent to the aforementioned verification model) that accepts extended inputs compared with the unmodified instantiation. A base multiset of inputs is considered for the unmodified instantiation, and an extended set of inputs, corresponding to the base multiset with appended unique tags as considered above, is considered for the modified instantiation. It is formally verified that the modified instantiation operates correctly with the extended inputs, at least to the extent that there is set equality between its inputs and outputs, and it is also formally verified that the outputs of the modified instantiation correspond (i.e. are the same in the base, unextended, part) to the outputs obtained from the unmodified instantiation. It is further verified, with reference to either the unmodified or modified instantiation (depending on the circumstances, which have been discussed above) that correct ordering occurs.

As described above for the implementation model, the multiset of inputs for the unmodified instantiation may be represented as n inputs, each of bit width m bits. As described above for the verification model, the set of inputs for the modified instantiation may be represented as n inputs, each of bit width (m+q) bits, where q are the extension bits encoding, as the LSBs of the extended inputs, the unique tag for each input. For each instantiation, the multiset or set of outputs will have the same format as the inputs.

The method 600 begins at block 602 where a hardware design for a sorter is received.

Once the hardware design for the sorter has been received the method 600 proceeds to block 604.

At block 604, it is formally verified that the modified instantiation operates correctly with the extended inputs, at least to the extent that there is set equality between its inputs and outputs, and it is also formally verified that the outputs of the modified instantiation correspond (i.e. have the same m MSBs) as the outputs obtained from the unmodified instantiation. That is, to check that the outputs correspond, it is checked if the m MSBs of the first output of the modified instantiation are the same as the first output of the unmodified instantiation, and so on. If the correct ordering of outputs is not verified with respect to the modified instantiation, then block 604 can also include verifying the correct ordering with respect to the unmodified instantiation.

As described above, formal verification is a systematic process that uses mathematical reasoning to verify one or more properties of a hardware design. In contrast, simulation-based verification is a process in which a hardware design is tested by applying stimuli to the hardware design and monitoring the output of the hardware design in response to the stimuli.

The formal verification comprises formally verifying one or more formal assertions are true, or hold, which if verified to be true establish that an instantiation of the hardware design will produce the correct output in response to any input. An assertion may also be referred to as a "lemma" in some programming languages and tools, such as Synopsys' HECTOR.

As is known to those of skill in the art, a formal assertion is a statement or expression that indicates that a formal property must be true for an instantiation of the hardware design to be behaving as expected. An example format for a formal assertion is assert property [FORMAL PROPERTY STATEMENT] which indicates that the FORMAL PROPERTY STATEMENT must be true. A formal property statement is a statement or expression that captures design behaviour. For example, a formal property statement for the property that signal a of the hardware design is equal to signal b of the hardware design may be a=b. Within HDL designs, a formal property statement is an executable statement that checks for specific behaviour within the HDL design. Formal property statements are used to capture required or desired temporal behaviour of an instantiation of the hardware design in a formal and unambiguous way.

Formal assertions are typically written in an assertion language. An assertion language, which also may be referred to as a property language, captures the design behaviour over one or multiple design cycles in a concise, unambiguous manner. While traditional hardware description languages (HDL), such as VHDL or Verilog RTL, have the ability to capture individual cycle behaviour, they are too detailed to describe properties at a higher level. In particular, assertion languages provide means to express temporal relationships and complex design behaviours in a concise manner. Assertion languages include, but are not limited to, SystemVerilog Assertions (SVA), Property Specification Language (PSL), Incisive® Assertion Library (IAL), Synopsys® OpenVera™ Assertions (OVA), Symbolic Trajectory Evaluation (STE), Hardware Property Language (HPL), 0-In®, and Open Verification Library (OVL).

As mentioned above, in the present case, the formal verification can then be performed to prove the following assertions:
(a) assert that the input and outputs of the modified instantiation are equal;
(b) assert that the most significant m bits of each instantiation's corresponding outputs are equal;
(c) assert that the output vectors are ordered (on either the modified or unmodified instantiation, bearing in mind considerations discussed above).

Once the formal assertions have been established, a formal verification tool is used to formally verify that the one or more formal assertions are true, or hold, for the hardware design. A formal verification tool is a software tool that is capable of performing formal verification of a hardware design. Formal verification tools include, but are not limited to, formal model checkers (which also may be referred to as formal property checkers) which are configured to formally verify one or more properties of an integrated circuit hardware design; and formal equivalence checkers which are configured to formally verify the equivalence of two designs (e.g. two integrated circuit hardware designs, or an integrated circuit hardware design and a netlist, or a hardware design and a model of the hardware design etc.). Examples of formal model checkers include, but are not limited to, OneSpin 360® DV, Mentor Graphics Questa® Formal Verification, Synopsys® VC Formal, Cadence® Incisive® Enterprise Verifier, and JasperGold®. Examples of formal equivalence checkers include, but are not limited to Synopsys® HECTOR, JasperGold® Sequential Equivalence Checking (SEC) App, and other logical equivalence checkers (LECs) and sequential logical equivalence checkers (SLECs).

In formal verification the hardware design (e.g. the hardware design for a sorter) is transformed into a mathematical model (e.g. a state-transition system, or a flow graph) to thereby provide an instantiation of the hardware design which can be tested to verify the hardware design, and the formal properties to be verified (e.g. the asserted properties) are expressed using mathematical logic using a precise syntax or a language with a precise mathematical syntax and semantics. In the present case, a modified instantiation is also produced and tested, as discussed above.

A formal verification tool verifies an assertion by searching the entire reachable state space of the modified and unmodified instantiations of the hardware design (e.g. state-transition system, or flow graph), without explicitly traversing all the states, to determine if there is a valid state (as defined by formal constraints) in which the asserted property is not true. The search is done by, for example, encoding the states using efficient Boolean encodings using Binary decision diagrams (BDDS), or using advanced SAT (satisfiability-based bounded model checking) based techniques. In some cases, tools can be used to implement techniques, such as, but not limited to, abstraction, symmetry, symbolic indexing, and invariants to improve performance and achieve scalability. Since formal verification of an assertion algorithmically and exhaustively explores all valid input values over time, verifying a property in this manner allows a property to be exhaustively proved for all valid states.

Once the formal verification is complete the method 600 may end or the method 600 may proceed to block 606.

At block 606, the formal verification tool used to perform the verification may output one or more signals that indicate whether the verification was successful. For example, when the formal verification tool is used to verify an assertion, the formal verification tool may output a signal that indicates whether or not the assertion is true (i.e. the asserted property is true for all valid states or sequence of states of the hardware design), which may also be referred to herein as the assertion being successfully verified. The output may be yes, the assertion is valid or has been successfully verified; no, the assertion is not valid (i.e. it is not true or has failed for at least one valid state or sequence of states) or has not been successfully verified; or the formal verification was inconclusive. The formal verification may be inconclusive, for example, because the computing-device running the formal verification tool has run out of memory or because the formal verification tool has determined that a certain amount of progress has not been made after a predefined period of time.

Where an assertion is not valid or has not been successfully verified the formal verification tool may also output information indicating a state or a sequence of states of the hardware design which cause the assertion to fail. For example, the formal verification tool may output a trace of the verification indicating at what point, state or sequence of states the failure has occurred. Once a signal has been output indicating whether the verification was successful the method 600 may end or the method 600 may proceed to block 608.

At block 608, a determination may be made as to whether the output signal(s) indicate that the verification was successful. If the output signal(s) indicate that the verification was successful, indicating that an instantiation of the hardware design for the sorter will behave correctly for all input vectors in the input space, then the method 600 may proceed to block 612 where the sorter defined by the hardware design is implemented in hardware. If, however the output signal(s) indicate that the verification was not successful, indicating that an instantiation of the hardware design will not behave correctly for all input vectors in the input space, then the method 600 may proceed to block 610 where the hardware design is revised to correct an error in the hardware design that caused the unexpected behaviour. Once the hardware design has been revised the revised hardware design may be re-verified (e.g. blocks 602-608 may be repeated for the revised hardware design).

Figure 7:
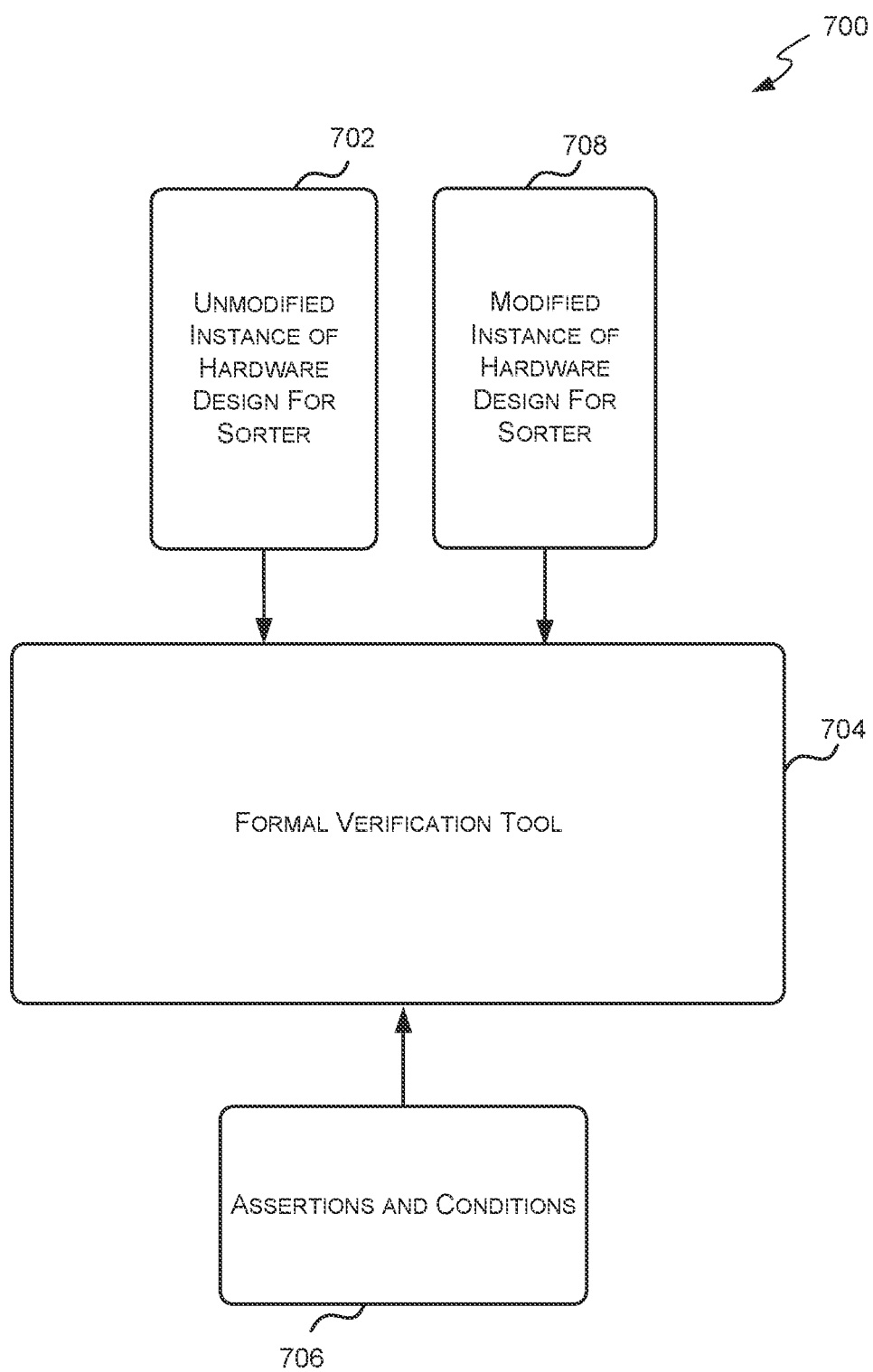
FIG. 7 is a block diagram of an example system for verifying a hardware design for a sorter.

Reference is now made to FIG. 7 which illustrates an example system 700 for performing the method 600 of FIG. 6. The system 700 may be implemented by one or more computing-based devices, such as the computing-based device 800 described below with reference to FIG. 8. For example, one or more of the components of the system 700 of FIG. 7 may be implemented as computer-readable instructions that, when executed at a computing-based-device, cause the computing-based device to perform the function of that component described below.

The system 700 comprises an unmodified instance of a hardware design for a sorter 702; a formal verification tool 704; and a set of assertions and conditions 706. As discussed above, the presented approach to verifying the hardware design for a sorter relies on assertions made in connection with a modified instantiation of the hardware design. As such, the system 700 also comprises a modified instance of the hardware design. In general, the formal verification tool 704 is configured to formally verify that the assertions are true for the hardware design under the associated conditions using mathematical reasoning.

The formal verification tool 704 is a software tool that is capable of performing formal verification of an integrated circuit hardware design, examples of which have been discussed above in connection with FIG. 6.

The assertions and conditions 706 correspond to those discussed above. That is, the following are the conditions (also referred to as "constraints") on the verification, which may be implemented as assumption statements:

(1) assume that all inputs are valid for the implementation and verification models;
(2) assume that the most significant m bits of each corresponding pair of inputs (i.e. an unextended input to the implementation model, and the corresponding extended input to the verification model) are equal (so that the inputs to the two different models differ only in the low-significance uniqueness bits); and
(3) assume that the q bits added to the inputs of the verification model are unique (having a known format such as one of those discussed above).

Moreover, the following are the assertions:

(a) assert that the input and outputs of the verification model (with unique elements) are equal;
(b) assert that the most significant m bits of each model's corresponding outputs are equal;
(c) assert that the output vectors are ordered (on either the modified or unmodified instantiation, bearing in mind considerations discussed above).

If the assertions are verified to be true for the hardware design under the specified conditions then it will be verified that an instantiation of the hardware design 702 produces the correct (or expected) result for all valid inputs.

When a formal verification tool 704 is used to verify an assertion, the formal verification tool 704 may output an indication of whether or not the assertion is valid (i.e. the asserted property is true for all valid states or sequence of states), which may also be referred to herein as the assertion being successfully verified. The output may be yes, the assertion is valid or has been successfully verified; no, the assertion is not valid (i.e. it is not true or has failed for at least one valid state or sequence of states) or has not been successfully verified; or the formal verification was inconclusive. The formal verification may be inconclusive, for example, because the computing-based device running the formal verification tool 704 has run out of memory or because the formal verification tool 704 has determined that a certain amount of progress has not been made after a predefined period of time.

Where an assertion is not valid or has not been successfully verified, the formal verification tool 704 may also output information indicating a state or sequence of states of the hardware design which causes the assertion to fail. For example, the formal verification tool 704 may output a trace of the verification indicating at what point, state or sequence of states the failure occurred.

Some results of verifications performed for an example hardware design for a sorter will now be considered.

The following approaches to formal verification were tested:

Naïve—Directly formally verifying the design with the conventional assertions that (i) the outputs are correctly ordered; (ii) all inputs appear on an output; and (iii) the inputs and outputs have the same multiplicity (i.e. that the every input appears in the outputs the correct number of times). In other words, this is a conventional, comprehensive, formal verification without any of the optimisation regarding multiplicity discussed above.

Unique Extension—Natural Encoding—Formally verifying the design by applying the unique tag approach discussed above, using a verification model of extended input width m+q, where $q=\lceil \log_2 \rceil$.

Unique Extension—One Hot Encoding—Formally verifying the design by applying the unique tag approach discussed above, using a verification model of extended input width m+q, where q=n.

The comparative results were obtained for a parameter space of $n \in \{4, 6, 8\}$ and $m \in \{8, 16, 32\}$ on a hardware design implementing a bitonic mergesort algorithm. Additional results for n=16, $m \in \{8, 16\}$ and n=32, m=16 were obtained for verifications performed with the unique extension approach only.

Table 1 summarises the time taken (in seconds) to complete each of the formal verifications listed above. The first column indicates the number of values being sorted, n and for each value of n the second column indicates the different bit widths, m, tested. The final three columns indicate the time taken for the verification to converge according to the different approaches (in order: Naïve, Unique Extension—Natural Encoding, Unique Extension—One Hot Encoding). It is noted that a value of "NA" in Table 1 corresponds to tests that were not performed, as tests for n=16 and n=32 were only performed for the natural encoding as mentioned above. It is also noted that the particular values of the results of these types of test will differ using different verification tools in different computer environments. Nonetheless, these results are illustrative of the benefits that can obtained.

TABLE 1

| | | | Solve time (s) | |
|---|---|---|---|---|
| n | m | Naive | Unique (natural enc.) | Unique (one hot enc.) |
| 4 | 8 | 10 | 11 | 8 |
|   | 16 | 10 | 10 | 32 |
|   | 32 | 23 | 14 | 18 |
| 6 | 8 | 448 | 17 | 17 |
|   | 16 | 442 | 17 | 22 |
|   | 32 | 820 | 45 | 50 |
| 8 | 8 | 18471 | 41 | 42 |
|   | 16 | 8729 | 64 | 105 |
|   | 32 | 34789 | 179 | 265 |

TABLE 1-continued

| | | | Solve time (s) | |
|---|---|---|---|---|
| n | m | Naive | Unique (natural enc.) | Unique (one hot enc.) |
| 16 | 8 | N/A | 926 | N/A |
|  | 16 | N/A | 2006 | N/A |
| 32 | 16 | N/A | 33745 | N/A |

It can be seen that for smaller values of n the solve times are broadly comparable, and of the same order of magnitude, for all three methods. In fact, at these values of n the solve times are so quick that the noise or error in the values (e.g. due to other processes on the host computer using resources etc) means that no strong conclusions can be drawn.

However, as n increases, so does the computational complexity and it can be seen that the naïve approach takes an order of magnitude longer to solve for n=6 than n=4, and an order of magnitude longer again to solve for n=8 than n=6. In contrast the solve times for both unique extension approaches increase much more slowly as n increases. At higher values of n it can be seen that the natural encoding approach performs better than the one hot encoding approach. However, both unique extension approaches are broadly comparable, and significantly faster than the naïve approach. For n=8, m=32 the natural encoding unique extension approach performs the verification in less than 3 minutes, compared to well over 9 hours for the naïve approach (and less than 4.5 minutes for the one hot approach). Indeed, the natural encoding unique extension approach solves the n=32, m=16 scenario in less time than the naïve approach takes to solve the far less complex n=8, m=32 scenario.

As such, it has been shown that the unique extension approach can produce dramatically improved performance for verifying hardware designs for sorters. It is noted that other optimisations for formally verifying sorters may be possible, depending on the circumstances, and the unique extension approach can be used in conjunction with those optimisations to further increase the speed of verification.

Figure 8:
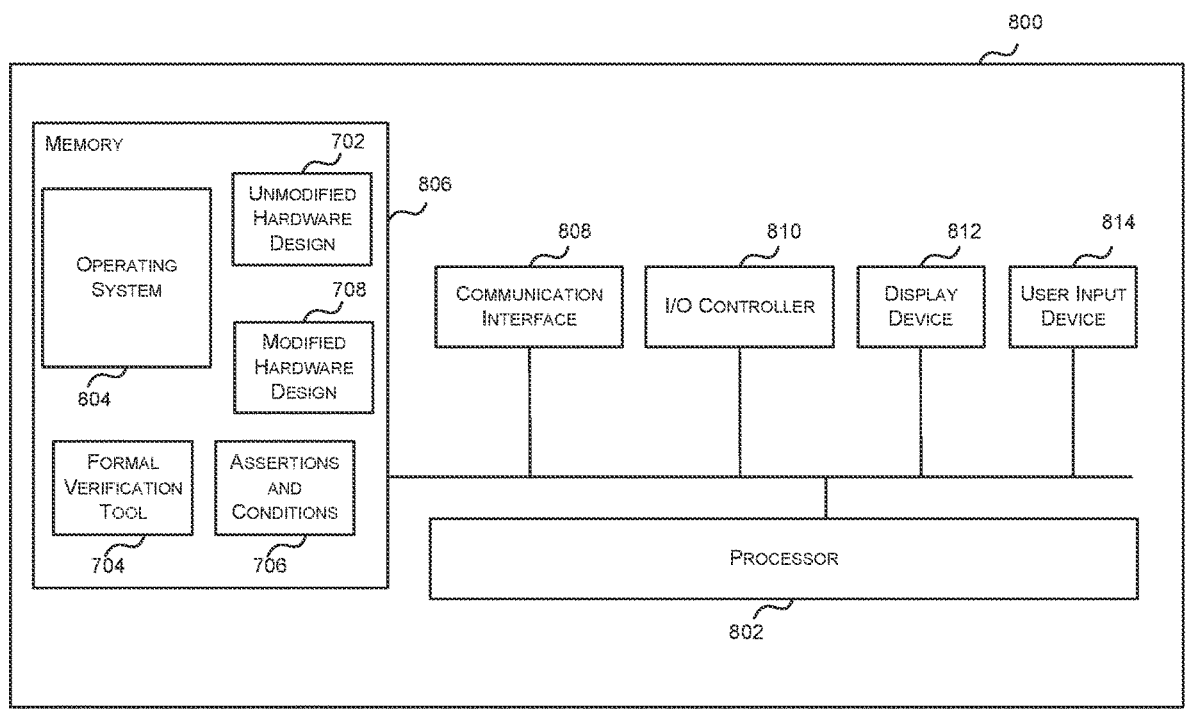
FIG. 8 is a block diagram of an example computing-based device.

FIG. 8 illustrates various components of an exemplary computing-based device 800 which may be implemented as any form of a computing and/or electronic device, and in which embodiments of the methods and systems described herein may be implemented.

Computing-based device 800 comprises one or more processors 802 which may be microprocessors, controllers or any other suitable type of processors for processing computer executable instructions to control the operation of the device in order to verify a hardware design for a sorter. In some examples, for example where a system on a chip architecture is used, the processors 802 may include one or more fixed function blocks (also referred to as accelerators) which implement a part of the method of verifying a hardware design for a component that implements a permutation respecting function, in hardware (rather than software or firmware). Platform software comprising an operating system 804 or any other suitable platform software may be provided at the computing-based device to enable application software, such as a formal verification tool 704, to be executed on the device.

The computer executable instructions may be provided using any computer-readable media that is accessible by computing-based device 800. Computer-readable media may include, for example, computer storage media such as memory 806 and communications media. Computer storage media (i.e. non-transitory machine readable media), such as memory 806, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 806) is shown within the computing-based device 800 it will be appreciated that the storage may be distributed or located remotely and accessed via a network or other communication link (e.g. using communication interface 808).

The computing-based device 800 also comprises an input/output controller 810 arranged to output display information to a display device 812 which may be separate from or integral to the computing-based device 800. The display information may provide a graphical user interface. The input/output controller 810 is also arranged to receive and process input from one or more devices, such as a user input device 814 (e.g. a mouse or a keyboard). This user input may be used to initiate verification. In an embodiment the display device 812 may also act as the user input device 814 if it is a touch sensitive display device. The input/output controller 810 may also output data to devices other than the display device, e.g. a locally connected printing device (not shown in FIG. 8).

Figure 9:
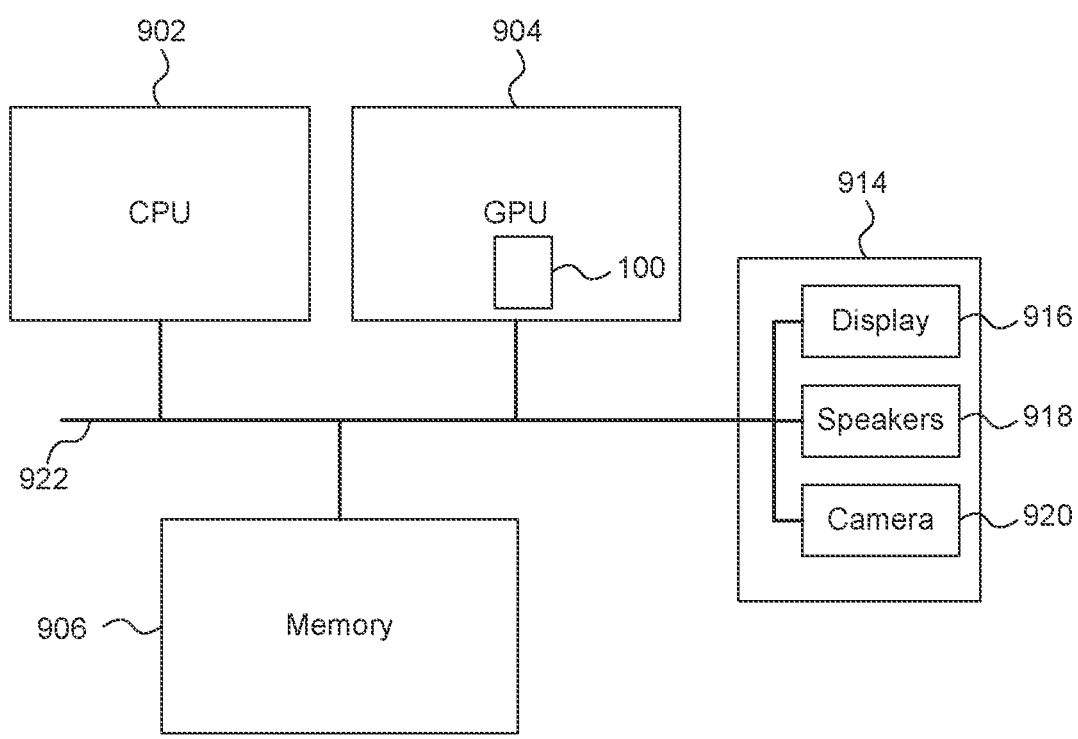
FIG. 9 is a block diagram of an example computer system in which a sorter may be implemented.

FIG. 9 shows a computer system in which a sorter 100 may be implemented. The computer system comprises a CPU 902, a GPU 904, a memory 906 and other devices 914, such as a display 916, speakers 918 and a camera 920. The GPU 904 is shown as comprising the sorter 100. In other examples, the sorter 100 may be implemented on the CPU 902. The components of the computer system can communicate with each other via a communications bus 922.

While FIG. 9 illustrates the implementation of a graphics processing system, it will be understood that a similar block diagram could be drawn for an artificial intelligence accelerator system—for example, by replacing the GPU 904 with a Neural Network Accelerator (NNA), or adding the NNA as an additional unit. In such cases, the sorter 100 can be implemented in the NNA.

The sorter described herein may be embodied in hardware on an integrated circuit. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset (which may also be referred to as a hardware design) that when processed (i.e. run) in an integrated circuit manufacturing system configures the system to manufacture a computing device comprising any apparatus described herein. An integrated circuit definition dataset may be, for example, an integrated circuit description.

Therefore, there may be provided a method of manufacturing, at an integrated circuit manufacturing system, a sorter as described herein. Furthermore, there may be provided an integrated circuit definition dataset that, when processed in an integrated circuit manufacturing system, causes the method of manufacturing a sorter to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset (e.g. a hardware design) at an integrated circuit manufacturing system so as to configure the system to manufacture a sorter will now be described with respect to FIG. 10.

Figure 10:
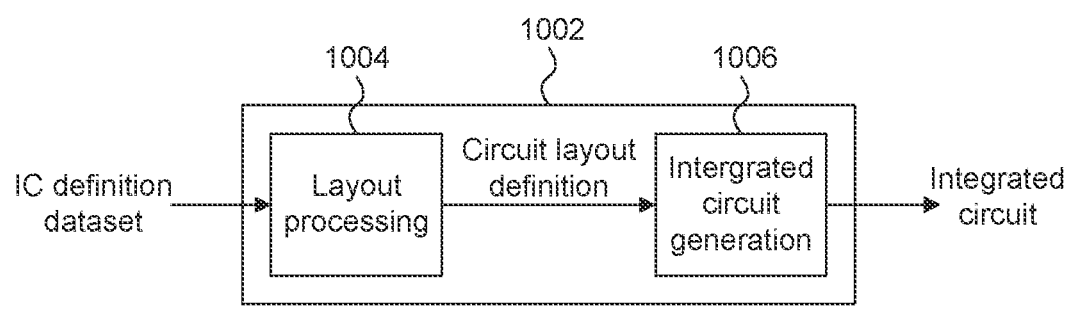
FIG. 10 is a block diagram of an example integrated circuit manufacturing system for generating an integrated circuit embodying a sorter.

FIG. 10 shows an example of an integrated circuit (IC) manufacturing system 1002 which is configured to manufacture a sorter as described in any of the examples herein. In particular, the IC manufacturing system 1002 comprises a layout processing system 1004 and an integrated circuit generation system 1006. The IC manufacturing system 1002 is configured to receive an IC definition dataset/hardware design (e.g. defining a sorter as described in any of the examples herein), process the IC definition dataset, and generate an IC according to the IC definition dataset (e.g. which embodies a sorter as described in any of the examples herein). The processing of the IC definition dataset configures the IC manufacturing system 1002 to manufacture an integrated circuit embodying a sorter as described in any of the examples herein.

The layout processing system 1004 is configured to receive and process the IC definition dataset/hardware design to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a sorter without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset/hardware design, when processed in an integrated circuit manufacturing system, may cause an integrated circuit manufacturing system to generate a device as described herein. For example, the configuration of an integrated circuit manufacturing system in the manner described above with respect to FIG. 10 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 10, the IC generation system may further be configured by an integrated circuit definition dataset/hardware design to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of verifying a hardware design for a sorter, the sorter accepting base inputs each of a bit width m, the method comprising:
formally verifying the hardware design of the sorter accepting a set of base inputs each of a bit width m by formally verifying aspects of a modified version of the hardware design of the sorter accepting a set of extended inputs with a bit width m+q, where q is a positive integer, and the most significant m bits of each extended input is equal to m bits of a respective base input.

2. The method according to claim 1, wherein the step of performing formal verification further comprises:
implementing a constraint that q least significant bits of each input in the set of extended inputs represent a unique value; and
wherein formally verifying aspects of the modified version of the hardware design of the sorter for the set of extended inputs comprises formally verifying that the most significant m bits of each sorted output of the modified version of the hardware design of the sorter are equal to a respective output obtained by an unmodified version of the hardware design of the sorter receiving the set of base inputs.

3. The method according to claim 1, wherein the set of base inputs consists of n inputs, and $q \geq \lceil \log_2 n \rceil$.

4. The method according to claim 3, wherein the q least significant bits of each input in the set of extended inputs represent a unique value from 0 to n−1.

5. The method according to claim 3, wherein $q \geq n$.

6. The method according to claim 5, wherein the q least significant bits of each input in the set of extended inputs implement a unique one hot encoding.

7. The method according to claim 1, wherein formally verifying aspects of the modified version of the hardware design of the sorter accepting the set of extended inputs comprises formally verifying set equality between the set of extended inputs and the set of outputs of the modified version of the hardware design of the sorter.

8. The method according to claim 7, wherein formally verifying aspects of the modified version of the hardware design of the sorter accepting the set of extended inputs further comprises formally verifying ordering by either:
further formally verifying aspects of the modified version of the hardware design of the sorter for the set of extended inputs by formally verifying the ordering of the outputs of the modified version of the hardware design of the sorter; or
formally verifying the ordering of the outputs of unmodified version of the hardware design of the sorter.

9. The method according to claim 8, wherein formally verifying the set equality comprises verifying that each of the outputs appears as an input and optionally formally verifying ordering comprises verifying that the outputs of the modified version of the hardware design of the sorter are in sequence and that neighbouring outputs are not equal.

10. The method according to claim 8, wherein formally verifying the set equality comprises verifying that each of the inputs appears as an output and optionally formally verifying the ordering comprises verifying that the outputs of the modified version or unmodified version of the hardware design of the sorter are in sequence.

11. The method according to claim 1, wherein formally verifying the hardware design of the sorter accepting the set of base inputs further comprises implementing a constraint that all the inputs in the set of base inputs are valid inputs for the unmodified version of the hardware design of the sorter, and that all the inputs in the set of extended inputs are valid inputs for the modified version of the hardware design of the sorter.

12. A method of manufacturing, using an integrated circuit manufacturing system, an integrated circuit comprising a sorter according to a hardware design for a sorter that has been verified according to claim 1 comprising inputting a computer readable dataset description of said integrated circuit to said integrated circuit manufacturing system.

13. A non-transitory computer readable storage medium having stored thereon computer readable code that causes the method as set forth in claim 1 to be performed when the code is run on at least one processor.

14. A system for verifying a hardware design a hardware design for a sorter, the sorter accepting base inputs each of a bit width m, the system comprising:
  memory configured to store:
    a formal verification tool; and
  one or more processors configured to formally verify the hardware design of the sorter accepting base inputs each of a bit width m, using the formal verification tool, by:
    formally verifying aspects of the modified version of the hardware design of the sorter accepting a set of extended inputs with a bit width m+q, where q is a positive integer and the most significant m bits of each extended input is equal to m bits of a respective base inputs.

15. The system according to claim 14, wherein the one or more processors are configured to perform formal verification, using the formal verification tool, by further:
  implementing a constraint that q least significant bits of each input in a set of extended inputs represent a unique value; and
  formally verifying aspects of the modified version of the hardware design of the sorter for the set of extended inputs comprises formally verifying that the most significant m bits of each sorted output of the modified version of the hardware design of the sorter are equal to a respective output obtained by an unmodified version of the hardware design of the sorter receiving the set of base inputs.

16. The system according to claim 14, wherein formally verifying aspects of the modified version of the hardware design of the sorter accepting the set of extended inputs further comprises formally verifying set equality between the set of extended inputs and the set of outputs of the modified version of the hardware design of the sorter.

17. The system according to claim 16, wherein formally verifying aspects of the modified version of the hardware design of the sorter accepting the set of extended inputs further comprises formally verifying ordering by either:
  further formally verifying aspects of the modified version of the hardware design of the sorter for the set of extended inputs by formally verifying the ordering of the outputs of the modified version of the hardware design of the sorter; or
  formally verifying the ordering of the outputs of unmodified version of the hardware design of the sorter.

18. The system according to claim 17, wherein formally verifying the set equality comprises verifying that each of the outputs appears as an input and optionally formally verifying the ordering comprises verifying that the outputs of the modified version of the hardware design of the sorter are in sequence and that neighbouring outputs are not equal.

19. The system according to claim 17, wherein formally verifying the set equality comprises verifying that each of the inputs appears as an output and optionally formally verifying the ordering comprises verifying that the outputs of the modified version or unmodified version of the hardware design of the sorter are in sequence.

\* \* \* \* \*